United States Patent [19]

Kelly et al.

[11] Patent Number: 5,007,689
[45] Date of Patent: Apr. 16, 1991

[54] INFRA-RED TRANSMITTING OPTICAL COMPONENTS AND OPTICAL COATINGS THEREFOR

[75] Inventors: Christopher J. Kelly, Hyndland, Scotland; Keith L. Lewis, Malvern, England

[73] Assignee: Barr & Stroud - U.K. Ministry of Defence, United Kingdom

[21] Appl. No.: 400,333

[22] Filed: Aug. 30, 1989

[30] Foreign Application Priority Data

Sep. 8, 1988 [GB] United Kingdom ............... 8821116

[51] Int. Cl.$^5$ .......................... G02B 1/10; G02B 5/26
[52] U.S. Cl. .................................. 350/1.6; 252/587; 264/1.7; 350/164
[58] Field of Search ............... 350/1.1, 1.6, 1.7, 164, 350/165; 357/2, 23.2; 252/587; 264/1.7

[56] References Cited

U.S. PATENT DOCUMENTS

| | | | |
|---|---|---|---|
| 4,194,108 | 3/1980 | Nakajima et al. | 357/63 |
| 4,449,780 | 5/1984 | Swinehart | 350/1.1 |
| 4,536,442 | 8/1985 | Bovenkerk et al. | 350/1.1 |
| 4,586,785 | 5/1986 | Swinehart | 350/1.1 |
| 4,697,202 | 9/1987 | Sher | 357/23.2 |
| 4,701,663 | 10/1987 | Kawakatsu et al. | 350/1.6 |
| 4,737,429 | 4/1988 | Mort et al. | 357/2 |

OTHER PUBLICATIONS

Reichelt et al., "The Preparation and Physical Properties of Diamond-Like Carbon Films", *Wear Resistant Coatings*, IPAT Workshop, Amsterdam, 26 and 27 May 1988.

Ma et al., "Night Moth Eye Window for the Millimetre and Sub-Millimetre Wave Region", *Optica Acta*, vol. 30, No. 12, 1983, pp. 1685-1695.

Bernhard et al., "The Insect Corneal Nipple Array", *Acta Physiologica Scandinavica*, vol. 69, Suppl. 243, Stockholm, 1965, Summary.

*Primary Examiner*—Bruce Y. Arnold
*Assistant Examiner*—Martin Lerner
*Attorney, Agent, or Firm*—Bell, Seltzer, Park & Gibson

[57] ABSTRACT

Infrared transmitting optical components having a wide variety of substrates (e.g. ZnS, ZnSe, Ge, Si, SiO$_2$) are disclosed all with an optical coating of boron phosphide (BP). The boron phosphide may be a single layer coating or one layer of a multilayer coating in which case it is preferably the penultimate layer. Coated components are provided which are very low in absorption, which are operable at high temperatures with minimal transmission loss, and which are transmitting in two IR wavebands. The boron phosphide layer is deposited by plasma-assisted chemical vapor deposition at a temperature in the range 300°-500° C. preferably using feedstock gases which are hydrogen-fee. Boron phosphide coatings of up to 40 μm in thickness have been achieved.

13 Claims, 3 Drawing Sheets

INFRA-RED TRANSMITTING OPTICAL COMPONENTS AND OPTICAL COATINGS THEREFOR

This invention relates to infra-red transmitting optical components and to optical coatings therefor.

Attention has been focused in recent years on the need for robust protective coatings for infra-red (IR) windows and in particular, for applications involving high velocities. Such coatings must transmit in the IR (typically between 3-5 $\mu$m and between 8-12 $\mu$m), be resistant to rain impact, be abrasion resistant, continue to transmit well at elevated temperatures eg. caused by aerodynamic heating, and be resistant to thermal shock.

The two commonly used hard and durable IR coating materials are diamond like carbon (DLC) and germanium carbide (GeC). DLC possesses undesirable absorption and is highly stressed thereby limiting the maximum coating thickness to around 1-2 $\mu$m and hence limiting the protection afforded. Although adhering well to certain IR window materials, in particular germanium (Ge), it will not adhere to zinc sulphide (Zn S) or zinc selenide (Zn Se) which are other commonly used IR window materials. However, Ge windows are of no use at elevated temperatures (>100° C.) due to absorption increase associated with free carrier absorption. Zn S and Zn Se have wider energy gaps than Ge and hence better high temperature transmission due to limited free carrier absorption. Hence they are generally the preferred IR window materials for elevated temperature applications. Ge C can be produced with a range of compositions (ratio of Ge to C) and a compromise between hardness and absorption has to be accepted. When produced in its most durable form, absorption levels are undesirable. Also, even in its most durable form, the protection afforded against rain impact is unsatisfactory. Finally, an increased number of IR systems operate in two wavebands namely at 1.06 $\mu$m and between 8-12 $\mu$m. Both DLC and Ge C are highly absorbing at 1.06 $\mu$m, thereby precluding their use in such a dual band system.

According to the present invention there is provided an infra-red transmitting optical component having a coating of non-crystalline boron phosphide.

The present invention also provides an infra-red transmitting component having a multi-layer anti-reflection coating at least one layer of which is amorphous boron phosphide. The boron phosphide layer need not be the final layer.

The present invention also provides an infra-red transmitting component having a coating of boron phosphide deposited thereon by plasma-assisted chemical vapour deposition at a temperature less than about 500° C.

The optical component may be made of Germanium or Zinc Sulphide or Zinc Selenide or Silicon or Quartz (Silica) or any other IR transmitting substrate materials.

By virtue of the present invention coated optical components are provided which have a coating capable of transmitting at both 1.06 $\mu$m and in the 8-12 $\mu$m range, which is extremely durable, which is very low in absorption and which is operable at high temperatures with minimal transmission loss.

Embodiments of the present invention will now be described by way of example with reference to the accompanying drawings, in which:

FIG. 1 schematically illustrates equipment for depositing Boron Phosphide coatings in accordance with the present invention;

Figure 1:
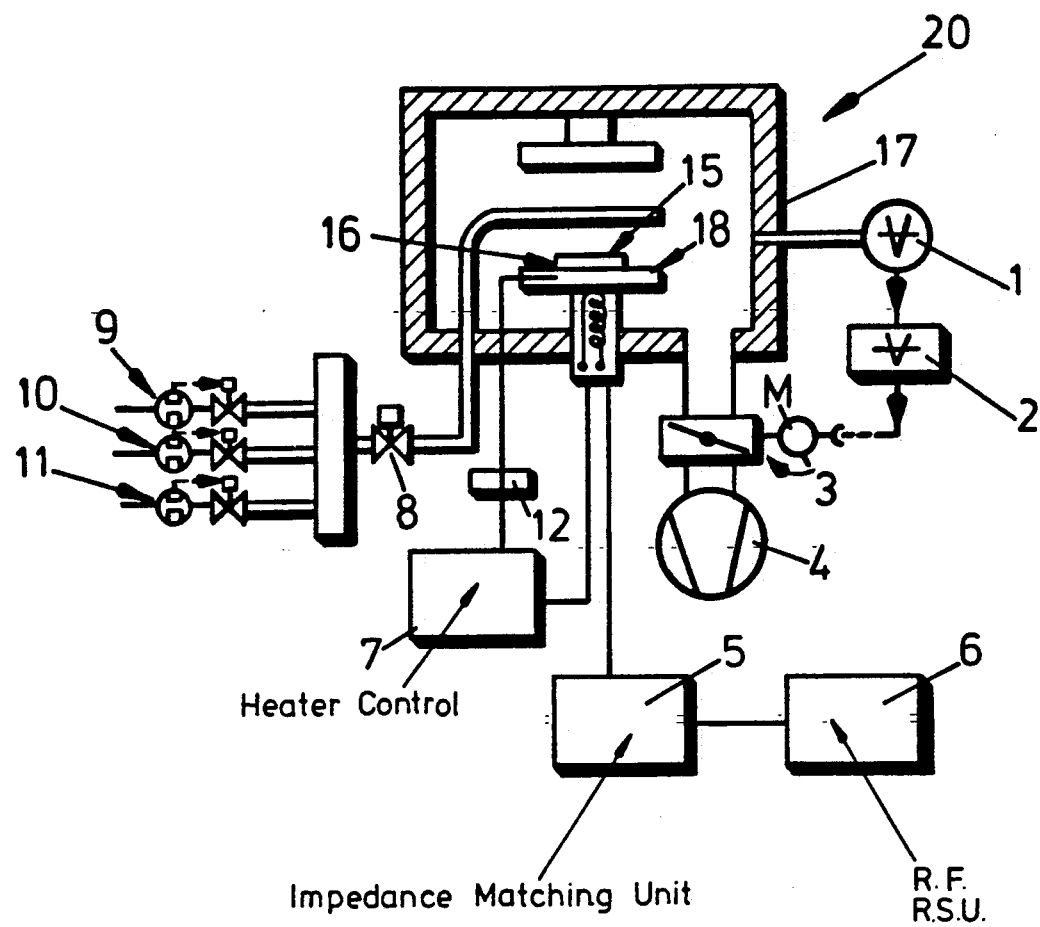

As is shown in FIG. 1 of the drawings apparatus 20 for coating optical components with Boron Phosphide comprises a vacuum chamber 17 having a cathode 18 for supporting an optical component 16 to be coated on its exposed surface 15. The cathode 18 is heated by a unit 7 and controlled in temperature by a controller 12 so that surface 15 is maintained at a desired temperature. Additionally A.C. power at radio frequencies (RF) is supplied to the cathode 18 by a power supply unit 6 via an impedance matching unit 5 (for maximum efficiency). The required level of vacuum is established within the chamber 17 by a high vacuum pump 4, motorized throttle valve 3, capacitance manometer 1 and vacuum controller 2 connected in closed loop. Gases are delivered into the chamber 17 by three pipelines with respective closed-loop mass flow controllers 9, 10, 11 via a common ON/OFF valve 8.

Prior to deposition commencing the substrate 16 is heated by unit 7 to an elevated temperature, typically 300-500° C. In the particular equipment used, the electrodes were of 8" diameter. Immediately prior to the coating being deposited, the surface 15 of the substrate 16 is cleaned by sputtering with argon applied via mass flow controller (MFC) 9. Following the sputter clean, the pressure in the chamber is adjusted to a particular value, typically 0.01-1 torr, and is maintained at this value automatically by valve 3, manometer 1 and controller 2. Diborane ($B_2 H_6$) is introduced to the chamber via MFC 10, at a flow rate typically of 5-30SCCM and similarly phosphine ($PH_3$) is introduced via MFC 11 typically at a a flow rate of 5-100SCCM. RF power, typically 10-1000 Watts, is supplied to the substrate carrying electrode (cathode 18) via auto-tuning (ie. impedance matching) units and a plasma is generated in the space between the two electrodes. As a result, a coating of Boron Phosphide (BP) is deposited on the surface 15 of the substrate 16. Deposition continues for a chosen time depending on the thickness required. Typically deposition rates lie around 1-3 $\mu$m per hour.

At the end of the process the gases are switched off, as is the RF power and substrate heating, and the equipment is allowed to cool for several hours to around ambient temperature, when the coated substrate is removed from the vacuum chamber 17.

Figure 7:
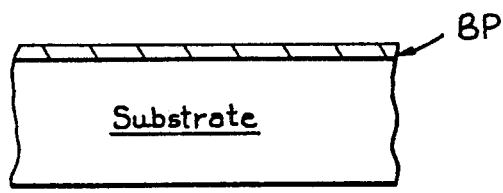
FIGS. 7 and 8 schematically illustrate substrates coated in accordance with the present invention.

Using this process, coatings of BP up to around 40 $\mu$m thick and possessing excellent properties have been successfully deposited on a variety of substrates as schematically illustrated in FIG. 7. These substrates include zinc sulphide (Zn S), zinc selenide (Zn Se), germanium (Ge), silicon (Si) and quartz ($SiO_2$).

The BP coatings prepared as described by the process of plasma assisted chemical vapour deposition were subjected to X-ray diffraction analysis and were found to possess a disordered non-crystalline structure. Such a structure is considered likely to have reduced free carrier mobility which at elevated temperatures would contribute to minimizing absorption.

Figure 2:
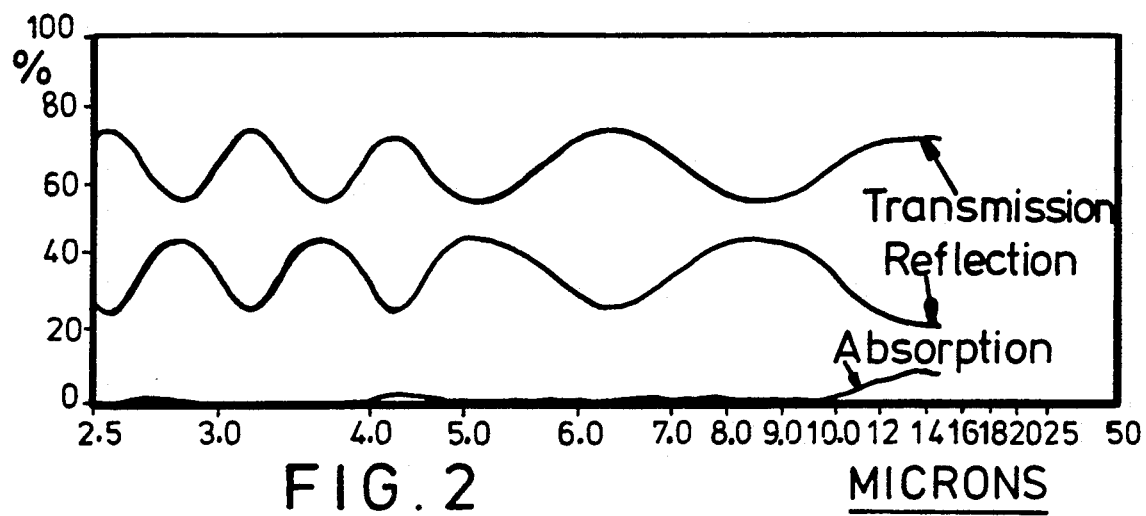
FIG. 2 illustrates the optical performance of a 2 $\mu$m thick Boron Phosphide coating on a Zinc Sulphide substrate produced in the FIG. 1 equipment.

Transmission and reflection measurements in the infra-red region were carried out on coatings of BP on different substrates following the deposition method described, using a Perkin Elmer PE580B infra-red spectrophotometer to derive absorption data and to correct for substrate absorption. Spectral traces between 2.5 and 14 $\mu$m of a 2 $\mu$m thick BP coatings on one face of a ZnS substrate are shown in FIG. 2. Analysis of these data allows computer derivation of the refractive index and absorption coefficient and the associated set of results is presented in Table 1 together with comparative values for a DLC coating. It is clear that BP is very significantly lower in absorption in the relevant wavelength regions.

To assess the broad band infra-red transmission capability of BP, various BP coatings were deposited (as previously described) on silicon wafers, which transmit reasonably well over a wide wavelength range and are readily available for use as substrates.

Figure 3:
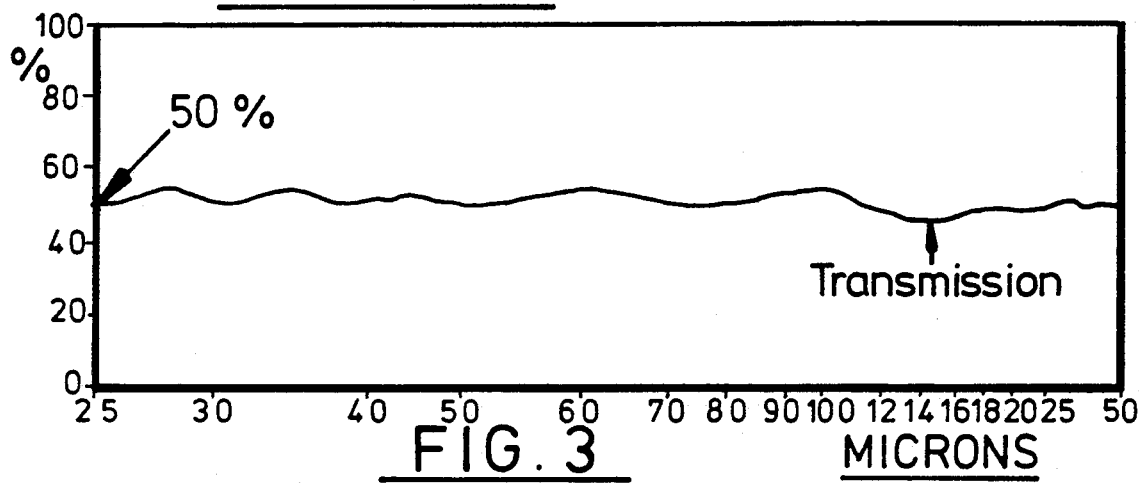
FIG. 3 illustrates the optical performance of a 2 $\mu$m thick Boron Phosphide coating on a Silicon substrate produced in the FIG. 1 equipment.

To allow for the effects of absorption in the silicon substrates, the transmission before and after coating was displayed as a ratio, multiplied by 0.5 (so that the trace sits mid-way on the graph paper). Thus only if absorption is present in the coating does the trace dip below the 50% line. FIG. 3 shows a typical trace and emphasizes the very broad band transmission capability of BP, with no deep absorption bands occurring from 2.5-50 $\mu$m.

Figure 4:
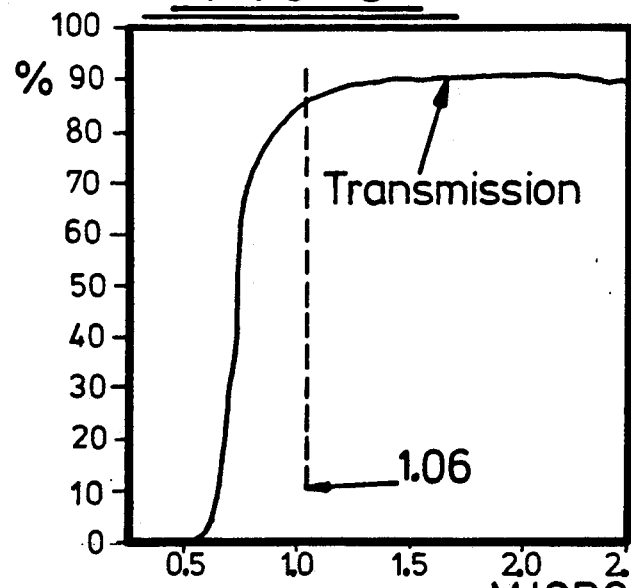
FIG. 4 illustrate the optical performance of a 4 $\mu$m thick Boron Phosphide coating on a Quartz substrate produced in the FIG. 1 equipment.

Transmission measurements were also carried out on a 4 $\mu$m thick BP coating on Quartz, in the near infra-red and visible, using a Perkin Elmer PE330 spectrophotometer, and a representative trace of the short wavelength transmission edge is shown in FIG. 4. Although showing some absorption at 1.06 $\mu$m, the coating transmits well and is suitable for dual band applications involving 1.06 $\mu$m and 8-11.5 $\mu$m. It is also noteworthy that the coating exhibits some transmission, albeit limited, in the red end of the visible spectrum.

High temperature transmission measurements were carried out on a number of coatings of BP on ZnSe substrates, using a Specac cell and Nicolet 10MX infra-red Fourier Transform Spectrophotometer and the results showed that average transmission loss between 8-11.5 $\mu$m, up to 500° C., is minimal—around 0.4% per micron film thickness.

The abrasion resistance of BP coatings was assessed as described in RSRE Specification TS 1888, Section 5.4.3 and involved 10K wipes of the coating with a rubber blade (loading 20g) in a slurry of sand and water. The tests were carried out using coatings of BP on FLIR Zn S substrates and a summary of the results is present in Table II. It is clearly evident that the abrasion resistance is excellent, with some samples being unmarked even after 100K wipes ie. 10X normal. In comparative tests on DLC on Ge, although unmarked after the normal 10K wipes, no sample remained unmarked after 30K wipes, clearly demonstrating the superior abrasion resistance of BP.

Single water drop impact tests on BP coatings on various substrates were carried out using equipment wherein compressed air supplies energy to a lead pellet which strikes a momentum exchanger, forcing a water jet from a nozzle at high velocity, and representative results are presented in Table III. Threshold velocities for damage were in excess of 205 m/s with the best achieved lying between 250-270 m/s. By way of comparison Ge C coatings, have a damage threshold velocity below 200 m/s, again emphasing the superior performance of BP as a protective coating against rain erosion.

Two coatings of BP on FLIR Zn S were subjected to multiple drop impact testing in a whirling arm rig (velocity 223 m/s, rainfall 25 mm/h, average drop size 2 mm). In both instances, there was a substantial incubation period during which no damage occurred, even at normal incidence. This behaviour is very unusual for infra-red materials which generally show little or no evidence of incubation periods. Comparison with the results of similar tests carried out on DLC again emphasized the superior performance of BP.

In the manufacturing process which has been described $B_2H_6$ and $PH_3$ were chosen as feedstock gases because they are both readily available from suppliers. However other feedstocks could be used provided they are gaseous under the vacuum conditions employed. There would include alternative hydrides, or halides of Boron and Phosphorus (or a combination). Some advantages might be gained in using feedstocks which exclude hydrogen, as inclusion of hydrogen in the coating structure can result in the presence of undesirable IR absorption brands.

Similar equipment to that shown in FIG. 1 is often used with the capability of heating both electrodes. It is often the case that practical investigation is necessary to decide which electrode should carry the substrate and which electrode should have the RF power applied to it.

Figure 8:
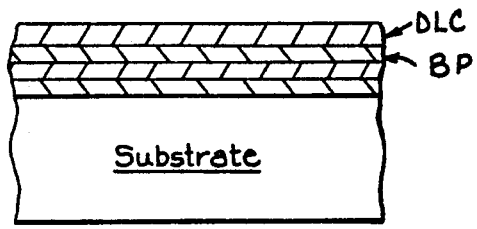

It is likely that BP would be used in conjunction with Zn S or Zn Se in the sort of applications envisaged ie. high velocity hence high temperature and it can be seen from FIG. 2 and Table 1 that the refractive index of BP makes it unsuitable as a single layer anti-reflection coating (ARC) for these materials. As such it will be necessary to combine it with a second, hard IR coating material in a multi-layer coating system which would exhibit both anti-reflection and protective properties as schematically illustrated in FIG. 8.

Figure 6:
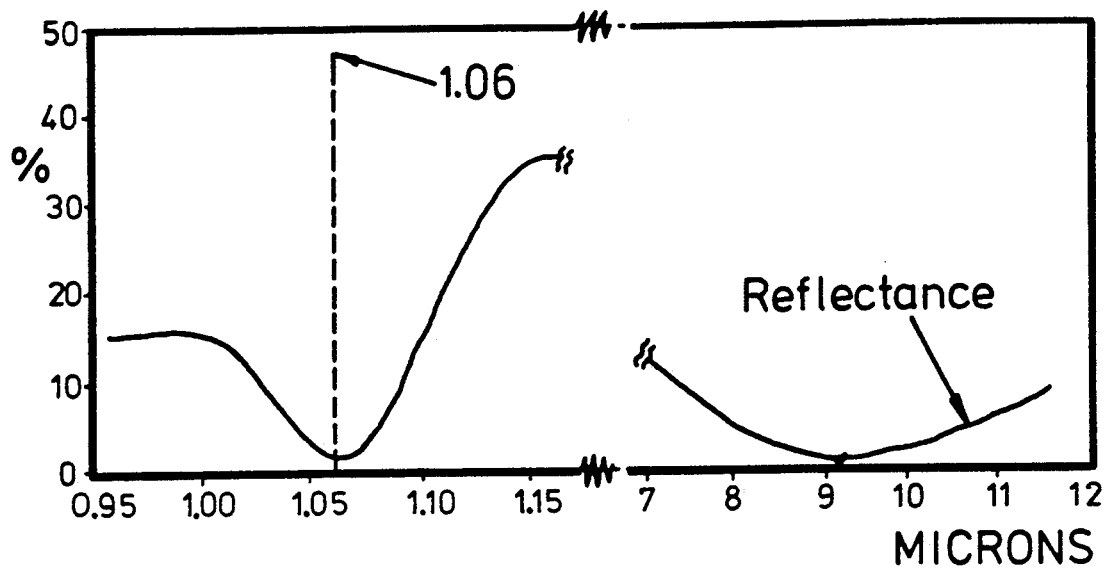
FIGS. 5 and 6 illustrate reflectance characteristics for multi-layer coatings incorporating at least one layer of Boron Phosphide.
Figure 5:
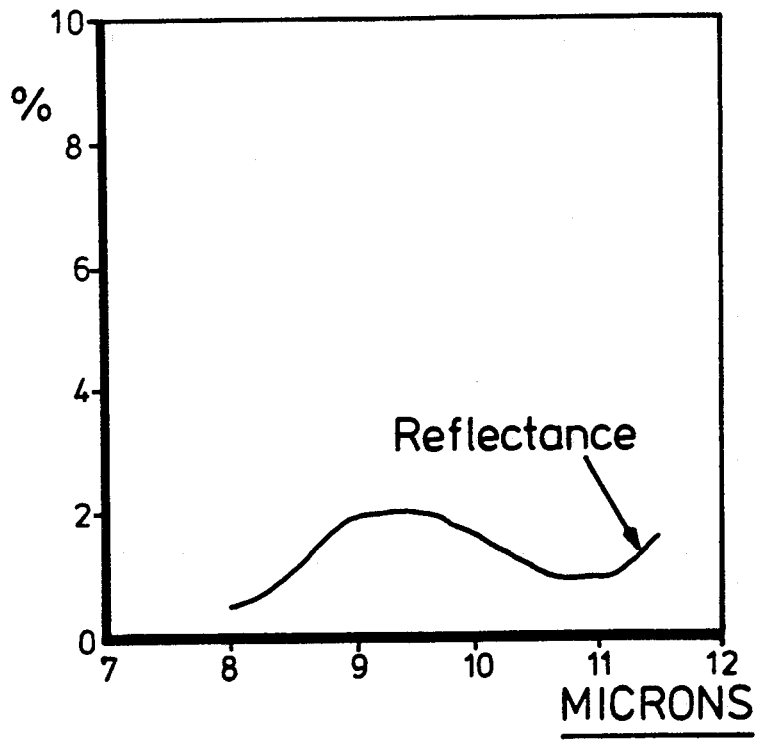

Designs have been derived for both a single band system (8-12 $\mu$m) and a dual band system (1.06 $\mu$m and 8-12 $\mu$m) details of which are set forth in Tables IV and V respectively. Reflectance characteristics are illustrated in FIGS. 5 and 6 respectively. From Table IV it will be evident that the single band system is a four layer coating on a ZnS substrate. This coating has an average reflectance of about 1.4%, an average transmission of about 92.6%, and an average absorption of about 6.0% over the 8-12 $\mu$m band. From Table V it will be evident that the dual band system is a two layer coating on a ZnS substrate. This coating in the 8-11.5 $\mu$m band has an average reflectance of about 3.5%, an average transmission of about 90%, and an average absorption of about 6.5%; at 1.06 $\mu$m the reflectance is 1.6%, the transmission is 97.9% and the absorption is 0.5%. It will also be noted that the Boron Phosphide layer is not the final layer but in each case is the penultimate layer on which a final layer of DLC is adherent. Despite the BP layer not being the final one the multi-layer coatings incorporating BP possess substantially all of the attributes of the single BP coatings described previously.

An alternative for achieving AR properties would be the so call Moth-eye effect which is described in "The Insect Corneal Nipple Array" Acta Physiologica (1965) and "Night Moth-eye Window for the Millimeter and Sub-Millimeter Wave Region" Optica Acta Vol. 30 (12). This relies on a specific pattern being etched into the surface of the BP resulting in an effect similar to a graded refractive index of a multilayer coating and producing broadband AR properties.

TABLE I

| MATERIAL | REFRACTIVE INDEX AT 10 μm (± 0.05) | AVERAGE ABSORPTION COEFFICIENT (cm$^{-1}$ ± 50) | | AVERAGE ABSORPTION PER μm PHYSICAL THICKNESS (% ± 0.5) | |
|---|---|---|---|---|---|
| | | 3–5 μm | 8–11.5 μm | 3–5 μm | 8–11.5 μm |
| BP | 3.1 | 20 | 80 | 0.3 | 0.8 |
| DLC | 2.0 | 200 | 480 | 1.8 | 4.8 |

TABLE II

| TEST DETAILS | PERFORMANCE OF BP | TYPICAL NUMBER OF WIPES REQUIRED TO MARK BP | BEST PERFORMANCE OF BP |
|---|---|---|---|
| 10,000 Wipes with Rubber Blade in a Slurry of Sand and Water (Loading (20 g) | Unmarked | >40,000 | Unmarked after 100,000 |

TABLE III

| SUBSTRATE | COATING THICKNESS (μm) | DAMAGE THRESHOLD VELOCITY (m/s) |
|---|---|---|
| ZnS (Water Clear) | 20 | 210 |
| Zns (Water Clear) | 37 | 250–270 |
| ZnSe | 18 | 205 |

TABLE IV

| | Material | Thickness* | Index |
|---|---|---|---|
| Substrate | ZnS | | 2.2 |
| First layer | BP | 0.3833 | 3.1 |
| Second layer | DLC | 1.1365 | 2.0 |

TABLE V

| | Material | Thickness* | Index |
|---|---|---|---|
| Substrate | ZnS | | |
| First layer | BP | 0.7343 | 3.1 |
| Second layer | Ge | 1.1825 | 4.1 |
| Third layer | BP | 0.2670 | 3.1 |
| Fourth layer | DLC | 0.7801 | 2.0 |

*Thickness measured in fractions of a quarter wave at 10 μm.

We claim:

1. An infra-red transmitting optical component having an anti-reflecting coating thereon of boron phosphide, the coating having been deposited on the component by plasma-assisted chemical vapor deposition at a temperature of less than about 500° C. and having a disordered non-crystalline structure.

2. A component as claimed in claim 1, wherein the coating is the result of deposition at a temperature in the range 300–500° C.

3. A component as claimed in claim 1, wherein the component comprises a substrate of zinc sulphide (ZnS) and the boron phosphide coating is 2 microns in thickness on the face of the substrate, the component having a refractive index value of 3.1, an average absorption co-efficient value of 20 in 3 to 5 micron waveband and 80 in the 8 to 11.5 micron waveband and respective average absorption values of 0.3 and 0.8.

4. A component as claimed in claim 1, wherein the component comprises a substrate of silicon (Si) and the boron phosphide coating is free of deep absorption bands in the 2.5 to 50 micron length range.

5. A component as claimed in claim 1, wherein the component comprises a substrate of quartz (SiO$_2$) and the boron phosphide coating is 4 microns in thickness, the component having a transmission characteristic for the 0.5 to 2.5 micron waveband which rises from zero at about 0.5 micron to about 90% at and above 1.06 micron.

6. A component as claimed in claim 1, wherein the component comprises a zinc selenide (ZnSe) substrate having a transmission loss at temperatures up to 500° C. for the 8 to 11.5 micron waveband of about 0.4% per micron of coating thickness.

7. A component as claimed in claim 1, wherein the plasma-assisted chemical vapor deposition utilizes feedstock gases which are hydrogen-free.

8. A component as claimed in claim 1, wherein the boron phosphide coating comprises one layer of a multilayer coating on the component substrate.

9. A component as claimed in claim 8, wherein the multilayer coating comprises a final layer of diamond-like carbon (DLC) and the penultimate layer is boron phosphide.

10. A component as claimed in claim 9, wherein the multilayer coating is as set forth in the Table, the material thicknesses being measured in fractions of a quarter wave at 10 microns:

TABLE

| | Material | Thickness | Index |
|---|---|---|---|
| Substrate | ZnS | | 2.2 |
| First layer | BP | 0.3833 | 3.1 |
| Second layer | DLC | 1.1365 | 2.0 |

11. A component as claimed in claim 9, wherein the multilayer coating is as set forth in the Table, the material thicknesses being measured in fractions of a quarter wave at 10 microns:

TABLE

| | Material | Thickness | Index |
|---|---|---|---|
| Substrate | ZnS | | |
| First layer | BP | 0.7343 | 3.1 |
| Second layer | Ge | 1.1825 | 4.1 |
| Third layer | BP | 0.2670 | 3.1 |
| Fourth layer | DLC | 0.7801 | 2.0 |

12. A component as claimed in claim 1, wherein the boron phosphide coating comprises surface etching to the 'Moth-eye effect' to provide characteristics similar to a multilayer coating.

13. A component as claimed in claim 1 having a boron phosphide coating with a thickness in the range up to 40 microns.

* * * * *